(12) United States Patent
Kajiwara et al.

(10) Patent No.: US 7,816,780 B2
(45) Date of Patent: Oct. 19, 2010

(54) SEMICONDUCTOR APPARATUS AND MANUFACTURING METHOD OF SEMICONDUCTOR APPARATUS

(75) Inventors: Ryoichi Kajiwara, Hitachi (JP); Kazutoshi Ito, Hitachi (JP)

(73) Assignee: Renesas Electronics Corporation, Kawasaki (JP)

(*) Notice: Subject to any disclaimer, the term of this patent is extended or adjusted under 35 U.S.C. 154(b) by 274 days.

(21) Appl. No.: 12/002,677

(22) Filed: Dec. 17, 2007

(65) Prior Publication Data

US 2008/0145607 A1 Jun. 19, 2008

(30) Foreign Application Priority Data

Dec. 18, 2006 (JP) .................. 2006-340473

(51) Int. Cl.
*H01L 23/48* (2006.01)
*H01L 23/58* (2006.01)
*H05K 3/46* (2006.01)

(52) U.S. Cl. .............. 257/692; 257/750; 257/778; 257/E23.01; 257/E23.018

(58) Field of Classification Search .......... 257/690, 257/692, 750, 778, E23.01, E23.017, E23.018
See application file for complete search history.

(56) References Cited

U.S. PATENT DOCUMENTS

| 4,735,847 | A | * | 4/1988 | Fujiwara et al. | ............ | 428/209 |
| 4,740,657 | A | * | 4/1988 | Tsukagoshi et al. | ....... | 174/88 R |
| 5,891,366 | A | * | 4/1999 | Gruenwald et al. | ......... | 252/514 |
| 6,143,116 | A | * | 11/2000 | Hayashi et al. | ............. | 156/233 |
| 6,940,156 | B2 | * | 9/2005 | Bauer et al. | .................. | 257/678 |
| 7,517,791 | B2 | * | 4/2009 | Morisue et al. | ............. | 438/622 |
| 7,524,528 | B2 | * | 4/2009 | Kodas et al. | ................. | 427/101 |
| 7,524,748 | B2 | * | 4/2009 | Fujimoto et al. | ............ | 438/597 |
| 2003/0148024 | A1 | * | 8/2003 | Kodas et al. | ................. | 427/125 |
| 2006/0055021 | A1 | * | 3/2006 | Yamamoto | ................... | 257/690 |
| 2006/0113671 | A1 | * | 6/2006 | Isa et al. | ..................... | 257/758 |
| 2006/0163744 | A1 | * | 7/2006 | Vanheusden et al. | ........ | 257/773 |
| 2006/0256247 | A1 | * | 11/2006 | Hirai et al. | .................... | 349/42 |
| 2006/0257662 | A1 | * | 11/2006 | Bujard et al. | ............... | 428/404 |
| 2007/0194449 | A1 | * | 8/2007 | Hirai | .......................... | 257/750 |
| 2008/0070011 | A1 | * | 3/2008 | Oh et al. | ..................... | 428/208 |

(Continued)

FOREIGN PATENT DOCUMENTS

JP       2003-308730       * 10/2003

(Continued)

OTHER PUBLICATIONS

Translation of JP 2005-340279 (from PAJ).*

(Continued)

*Primary Examiner*—Mary Wilczewski
(74) *Attorney, Agent, or Firm*—Townsend and Townsend and Crew LLP

(57) ABSTRACT

A technique capable of improving reliability of a semiconductor apparatus is provided. A semiconductor device having a metal electrode on at least one principal surface and a die pad (a metal member) electrically connected to the metal electrode via conductive resin composed of base resin (an organic binder) mixed with a Ag particle (metal powder) including precious metal are provided, and a configuration is made so that a porous nano-particle coat film (a precious metal layer) having an Ag (precious metal) nano particle fired on a metal surface is formed on at least one of mutually opposed surfaces of the metal electrode and the die pad.

10 Claims, 10 Drawing Sheets

U.S. PATENT DOCUMENTS

| | | | |
|---|---|---|---|
| 2008/0093111 A1* | 4/2008 | Tsurumi | 174/257 |
| 2008/0145607 A1* | 6/2008 | Kajiwara et al. | 428/137 |
| 2009/0096100 A1* | 4/2009 | Kajiwara et al. | 257/741 |
| 2009/0134364 A1* | 5/2009 | Nawafune et al. | 252/513 |
| 2009/0189264 A1* | 7/2009 | Yato et al. | 257/676 |

FOREIGN PATENT DOCUMENTS

| | | |
|---|---|---|
| JP | 2005-093826 | 4/2005 |
| JP | 2005-340279 | 12/2005 |
| JP | 2008-153470 * | 7/2008 |

OTHER PUBLICATIONS

Ukita et al. "Application of Conductive Paste Containing Silver Nanoparticles," 11th Symposium on Microjoining and Assembly Technology in Electronics, pp. 233 to 238, (Feb. 2005).

* cited by examiner

FIG. 14

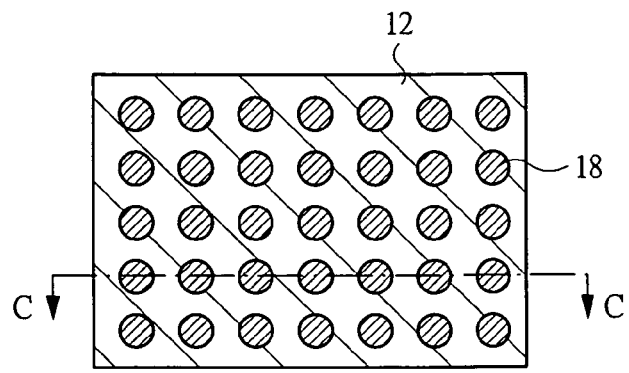

FIG. 15

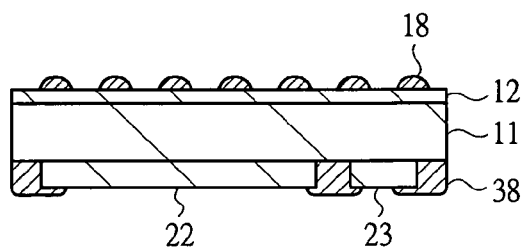

FIG. 16

```
┌─────────────────────────────────────────────────────┐
│     WAFER HAVING ELECTRODE ON REAR SURFACE          │
└─────────────────────────────────────────────────────┘
                          │
┌─────────────────────────────────────────────────────┐
│ APPLICATION OF Ag NANO-PASTE ON REAR SURFACE OF WAFER│
│              (SUPPLIED BY DISPENCER)                 │
└─────────────────────────────────────────────────────┘
                          │
┌─────────────────────────────────────────────────────┐
│   HEATING OF WAFER TO 250 TO 300 °C IN ATMOSPHERE   │
└─────────────────────────────────────────────────────┘
                          │
            ┌──────────────────────────┐
            │    CLEANING OF WAFER     │
            └──────────────────────────┘
                          │
            ┌──────────────────────────┐
            │     DICING OF WAFER      │
            └──────────────────────────┘
```

SEMICONDUCTOR APPARATUS AND MANUFACTURING METHOD OF SEMICONDUCTOR APPARATUS

CROSS-REFERENCE TO RELATED APPLICATION

The present application claims priority from Japanese Patent Application No. JP 2006-340473 filed on Dec. 18, 2006, the content of which is hereby incorporated by reference into this application.

TECHNICAL FIELD OF THE INVENTION

The present invention relates to packaging technology of a semiconductor device and, particularly, relates to technology applied effectively to a semiconductor apparatus having a structure in which a semiconductor device is electrically connected to an external connection terminal of the semiconductor apparatus using no lead (lead-free).

BACKGROUND OF THE INVENTION

For example, Japanese Patent Application Laid-Open Publication No. 2005-93826 (Patent Document 1) describes a connection structure comprising: an electrode connection portion in which conduction is established by fusion bond between at least one of a first electrode provided in a first electric structure and a second electrode provided in a second electric structure and metal fine powder; and an intermediate connection portion in which conduction at an intermediate portion between the first electrode and the second electrode is established by conductive adhesive, wherein the metal fine powder is metal fine powder in which fusion bonding occurs at temperature equal to or lower than thermal hardening temperature of the conductive adhesive, and the conductive adhesive is a conductive adhesive including a conductive filler having a particle diameter in which fusion bonding does not occur at temperature equal to or lower than the thermal hardening temperature of the conductive adhesive.

And, Japanese Patent Application Laid-Open Publication No. 2005-340279 (Patent Document 2) describes a structure in which micro-particle conductive paste composed of a μm-size metal filler and nano-particle conductive paste composed of a nm-size metal filler is laminated and filled in layer form in a via-hole and the nano-particle conductive paste exists in layer form between the micro-particle conductive paste and a conductive layer.

And, in a technical paper, 11th Symposium on "Microjoining and Assembly Technology in Electronics", pp 233 to 238, (2005. 2) (Non-Patent Document 1), review of application of nano-composite Ag paste material in which an Ag nano-particle is mixed with conventional Ag paste to die-bonding of a power semiconductor apparatus is reported. In this paper, there is a description that thermal cycling reliability, PCT (Pressure Cooker Test) reliability, a heat dissipation characteristic and an electrical conduction characteristic of a die-bonding portion are more excellent in the nano-composite Ag paste compared with conventional Ag paste connection. It is considered therein that the improvement of characteristic is achieved because the Ag nano-particle is interposed between Ag particles and causes a fusion bonding phenomenon by heating of 200° C., and therefore, the Ag nano-particle contributes to joint between the Ag particles. Note that, it is considered that, in order to improve the characteristic, a predetermined pressing pressure has to be applied in a processing of subjecting the nano-composite Ag paste to hardening baking.

SUMMARY OF THE INVENTION

A power semiconductor apparatus represented by a transistor package and the like has a package structure in which a rear surface electrode of a vertical semiconductor device controlling on/off of a current and a die pad of a lead frame are connected with die-bonding, a main electrode and a control electrode in a circuit surface side are electrically connected to respective leads for external connection and the entirety of the semiconductor device, the entirety of or a part of the die pad and a part of the leads for external lead-out are molded by insulating resin.

As a method of electrically connecting the vertical semiconductor device to the die pad, conventionally, a power semiconductor apparatus having high-capacity or intermediate-capacity (having size in which a longest side of an outer shape of the semiconductor device is longer than 4 mm) employs die-bonding using high-lead soldering for a product. On the other hand, a power semiconductor apparatus having low-capacity (having size in which a longest side of an outer shape of the semiconductor device is equal to or shorter than 4 mm) with small chip size employs die-bonding using Ag paste which is conductive resin obtained by mixing an Ag-particle into an organic binder.

On a rear surface electrode of these vertical semiconductor devices, a precious metal layer of, for example, Au or Ag is formed on an uppermost surface thereof, and a die pad surface subjected to die-bonding by Ag paste has a structure plated with Ag. As for a content of Ag in the Ag paste, in order to satisfy electric and thermal characteristics required for the power semiconductor apparatus, highly-conductive Ag paste in which an Ag particle of equal to or more than 80% in weight rate is mixed is used.

Recently, in order to respond to elimination of lead (lead-free) in a semiconductor apparatus along with RoHS restrictions, there is a trend of studying application of lead-free conductive Ag paste also to a power semiconductor apparatus having intermediate capacity or large chip size instead of die-bonding of high-lead soldering.

On the other hand, as another recent trend, as described in Non-Patent Document 1, Ag paste material utilizing nano-technology is developed, and nano-composite Ag paste material in which an Ag nano-particle is mixed with conventional Ag paste is proposed.

The present inventors studied a connection structure of a semiconductor device using conductive resin and found below problems.

In a case where conductive Ag paste is applied as connection material of die-bonding of a power semiconductor, since high thermal conductivity and low electrical resistance characteristic are required for the Ag paste, material in which Ag content in paste is about 80 to 90 wt % is used.

The larger the Ag content, the smaller a rate of resin making elastically deformation readily. And therefore, rigidity of a joint layer after a hardening processing is increased, and deformation absorption capacity of the joint layer is reduced. There is a problem that when the joint layer is deformed beyond the deformation absorption capacity, exfoliation readily occurs in a joint interface between: resin having lower strength compared with rupture strength of an Ag particle and resin; and an Ag particle, a rear surface electrode of a device or a die pad. If exfoliation occurs in the joint interface, reliability of the power semiconductor is deteriorated.

Although a joint mechanism of resin and metal is not clear, joint strength of a combination in which a functional group of resin and a metal atom are bonded ionically is high, and joint strength of a combination in which adhesion is carried out merely by physical adsorption without chemical action is low, generally.

Precious metal is poor in a chemical action with resin in general, and, among them, Au is the most poorest in a chemical action. As a result of studies carried out by the inventors, joint strength equal to or higher than physical adsorption is obtained in resin material including sulfur, however, connection strength thereof is low.

A rear-surface electrode of a semiconductor device is often composed of a deposited-film having an uppermost surface of Au and a surface shape of the rear-surface electrode is flat and smooth. And therefore, reinforcement effect in shape such as anchor effect is hardly obtained structurally. Thus, strength of a joint interface between a rear-surface electrode of a device and Ag paste is particularly low compared with others.

And therefore, a product in which thermal deformation generated between a chip and a die pad of a lead frame is larger than a predetermined value has a problem that, under a condition in which thermal deformation such as 260° C.-reflow or thermal cycling is applied, a joint interface between a rear-surface electrode of a device and Ag paste is exfoliated easily, and reliability necessary for the product cannot be ensured.

And therefore, die-bonding using Ag paste is not applied to a power semiconductor package having intermediate capacity or having size exceeding predetermined size (size in which longest side of an outer shape of the semiconductor device is 4 mm).

In Patent Document 1 and Patent Document 2, only a connection state that metal fine powder (nano-powder) and an electrode (a conductive layer) are fusion-bonded is emphasized and a state of a connection interface between conductive resin and an electrode is not mentioned.

And this problem is also same in composite Ag paste mixed with an Ag nano-particle, and merely short life of thermal cycling test can be obtained because of exfoliation of a joint interface between a rear-surface electrode of a chip and the composite Ag paste. And therefore, reliability necessary for the product cannot be ensured.

An object of the present invention is to provide technology capable of improving reliability of a semiconductor apparatus.

The above and other objects and novel characteristics of the present invention will be apparent from the description of this specification and the accompanying drawings.

The typical ones of the inventions disclosed in this application will be briefly described as follows.

A semiconductor device having a metal electrode on at least one of principal surfaces and a metal member electrically connected with the metal electrode via conductive resin in which metal powder including precious metal is mixed with an organic binder are provided. And, on at least one surface of the mutually opposed surfaces of the metal electrode and the metal member, a porous precious metal layer in which an nano-particle of precious metal is fired on a metal surface is formed.

The effects obtained by typical aspects of the present invention will be briefly described below.

That is, reliability of a semiconductor apparatus can be improved.

BRIEF DESCRIPTIONS OF THE DRAWINGS

FIG. 14 is a plan view showing a semiconductor apparatus formed in a state in which an Ag nano-particle coat film is scattered in a plurality of regions of a surface of a rear surface electrode of a semiconductor device of a fifth embodiment of the present invention;

FIG. 15 is a cross sectional view taken along a line C-C shown in FIG. 14;

FIG. 16 is an explanatory diagram showing an example of a formation procedure of a nano-particle coat layer on a rear surface of a semiconductor device;

DESCRIPTIONS OF THE PREFERRED EMBODIMENTS

Components having the same function are denoted by the same reference symbols throughout the drawings for describing the embodiment, and the repetitive description thereof will be omitted. Hereinafter, embodiments of the present invention will be described in detail with reference to the accompanying drawings.

First Embodiment

Figure 1:
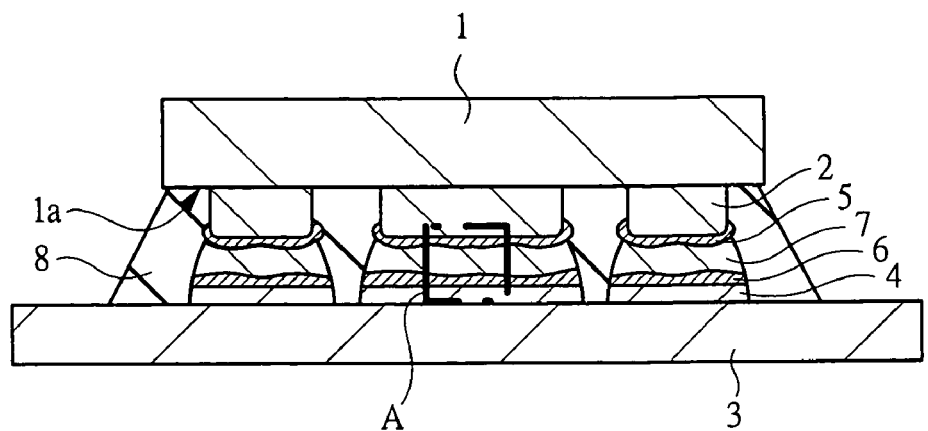
FIG. 1 is a cross sectional view showing a state in which a semiconductor device of a first embodiment of the present invention is flip-chip-bonded to a wiring substrate.

FIG. 1 is a cross sectional view showing a state in which a semiconductor device of a first embodiment of the present invention is flip-chip-bonded to a wiring substrate.

In FIG. 1, a plurality (three in FIG. 1) of projection-like electrode terminals (metal electrodes, first electrodes) 2 are formed over one principal surface (a first principal surface) 1a of an semiconductor device 1. Examples of material of the electrode terminal 2 include Ag and Au. Note that, although three electrode terminals 2 are formed on the principal surface 1a of the semiconductor device 1 in FIG. 1, the number of the electrode terminals 2 is not limited to three, and an appropriate number can be selected in accordance with application or a function of the semiconductor apparatus.

And, in a lower side of the electrode terminals 2, a wiring substrate 3 is disposed so that it is opposed to the principal surface 1a of the semiconductor device 1. The wiring substrate 3 is an insulating substrate such as insulating resin on which a wiring member, for example Cu, is formed in a predetermined wiring pattern.

And, on the wiring substrate 3, a connection terminal (a metal member, a first metal member) for electrical connection with the semiconductor device 1 is formed. The connection terminal 4 has a structure in which Ni/Au plating is performed on a Cu pattern wired on the insulating substrate. That is, a surface of the connection terminal 4 opposed to the electrode terminal 2 is composed of Au, which is precious metal.

And, on surfaces of the electrode terminals 2 in a semiconductor device 1 side and the connection terminal 4 in a wiring substrate 3 side, paste of an Ag nano-particle is printed, and a nano-particle coat film (a precious metal layer, a first precious metal layer) 5 and a nano-particle coat film (a second precious metal layer) 6 of Ag fired at temperature of 200 to 500° C. are formed, respectively.

Thicknesses of the nano-particle coat films 5 and 6 are in a range of 100 nm to 10 μm. This is because, if these thicknesses are more than 10 μm, a cost thereof increases, and if these thicknesses are smaller than 100 nm, supply of the Ag nano-particle paste at printing is difficult.

And, the nano-particle coat films 5 and 6 are joined by conductive resin 7 in which an Ag particle is mixed with epoxy resin. Base resin of the conductive resin 7 has high fluidity before hardening and is hardened in a state of entering an opened hole portion of the Ag nano-particle coat.

States of joint interfaces by which the nano-particle coat film 5 formed on the electrode terminal 2 and the nano-particle coat film 6 formed on the connection terminal 4 are respectively connected with the conductive resin 7 are described.

Figure 2:
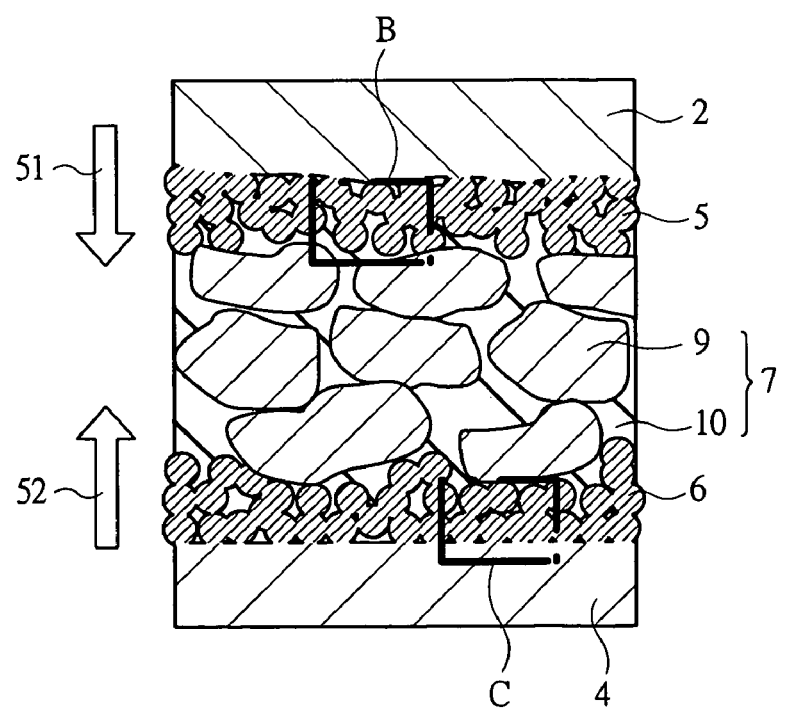
FIG. 2 is an enlarged cross sectional view of a region surrounded by a chain line A shown in FIG. 1.
Figure 3:
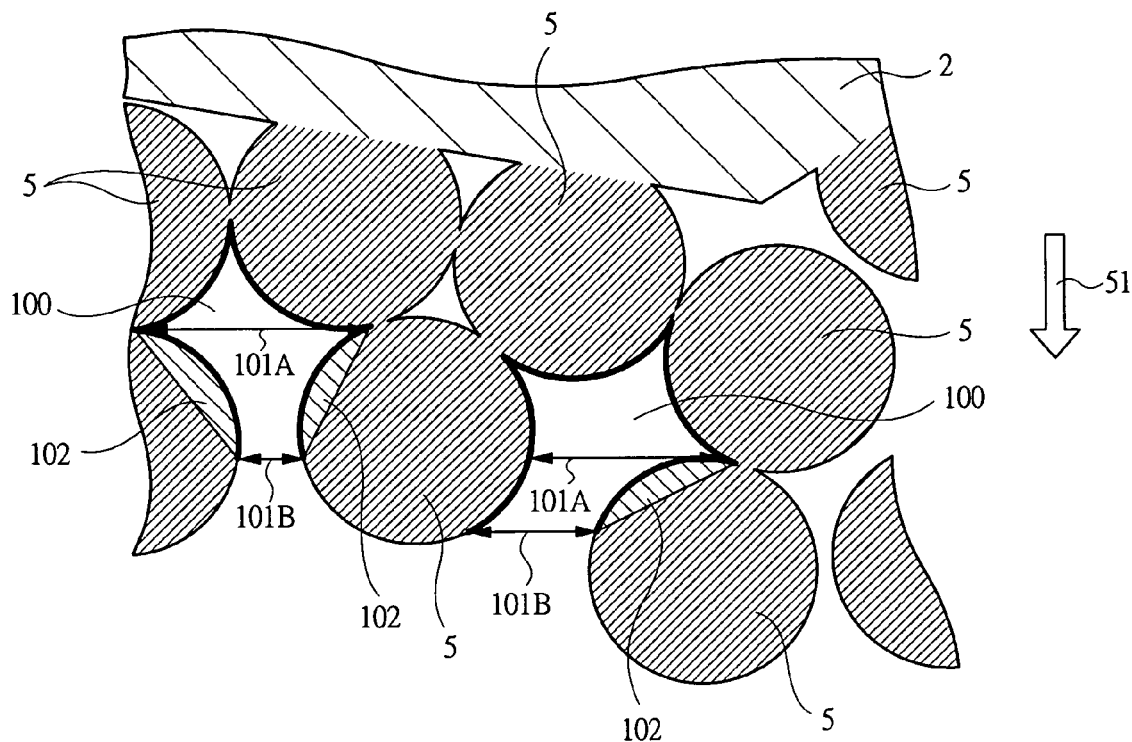
FIG. 3 is an enlarged cross sectional view showing a state of a region surrounded by a chain line B shown in FIG. 2 before jointing by conductive resin.
Figure 4:
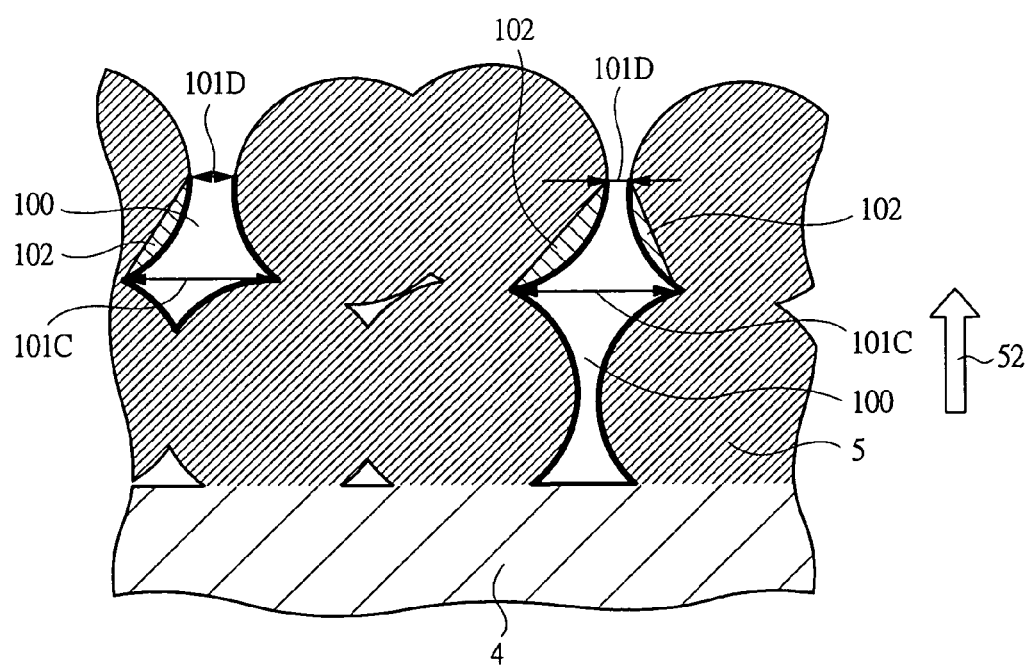
FIG. 4 is an enlarged cross sectional view showing a state of a region surrounded by a chain line C shown in FIG. 2 before jointing by the conductive resin.

FIG. 2 is an enlarged cross sectional view obtained by enlarging a region surrounded by a chain line A shown in FIG. 1, FIG. 3 is an enlarged cross sectional view showing a state of a region surrounded by a chain line B shown in FIG. 2 before joint by the conductive resin, and FIG. 4 is an enlarged cross sectional view showing a state of a region surrounded by a chain line C shown in FIG. 2 before joint by the conductive resin.

In FIG. 2, the conductive resin 7 is composed of an Ag particle 9 and base resin 10 which is an organic binder. Particle size (longest length in a longitudinal direction) of the Ag particle 9 is 0.5 to 50 μm. A content of the Ag particle 9 mixed in the conductive resin 7 is 65 to 98 wt %. This is because, that if the content of the Ag particle 9 is smaller than 65 wt %, an electrical conduction characteristic is insufficient, and if the content is larger than 98 wt %, a joint characteristic of the conductive resin 7 is deteriorated.

And, as shown in FIG. 2, the nano-particle coat films 5 and 6 have a porous structure. The coat films 5 and 6 of the nano-particles are films in which rough and large particles obtained by fusion/aggregation of nano-particles are mutually combined. Numerous holes exist therein, and numerous hole portions are open in a surface. Irregularity on surfaces of the nano-particle coat films 5 and 6 are also noticeable, and they are films well roughened in micro scale.

As shown in FIG. 3, a plurality of hole portions 100 is formed in the surface of the nano-particle coat film 5. The hole portions 100 have an opening portion (a first opening portion) 101A and an opening portion (a second opening portion) 101B sequentially along a direction (a first direction) 51 directed from the electrode terminal 2 to the connection terminal 4 shown in FIG. 2.

In the plurality of hole portions 100 in the surface of the nano-particle coat film 5, the base resin 10 of the conductive resin 7 is hardened in a state of entering the hole portion 100 as shown in FIG. 2.

Here, a part of the opening portion 101A shown in FIG. 3 is covered with a bulging portion 102 which is a part of the nano-particle coat film 5. The bulging portion 102 is formed in an opening portion 101B side.

By forming the bulging portion 102, the base resin 10 hardened in a state of entering the hole portion 100 transits to a state embedded in the nano-particle coat film 5 like an anchor. And therefore, by the anchor effect of the base resin 10, a phenomenon that the conductive resin 7 shown in FIG. 2 is exfoliated from the electrode terminal 2 toward the connection terminal 4 can be suppressed.

And, the nano-particle coat film 5 and the electrode terminals 2 are fusion-bonded at a connection interface by firing at temperature of 200 to 500° C. with a nano-particle applied in advance. And therefore, connection strength of the connection interface of the nano-particle coat film 5 and the electrode terminal 2 is larger than connection strength of the connection interface of the nano-particle coat film 5 and the conductive resin 7.

That is, by forming the nano-particle coat film 5 having the plurality of hole portions 100 having the bulging portion 102, the connection strength of the conductive resin 7 and the electrode terminal 2 can be improved compared with a case in which the nano-particle coat film 5 is not formed. And therefore, since generation of a defect caused by interface exfoliation in an actual usage environment can be suppressed, a connection structure using the conductive resin of high reliability can be obtained.

And, as shown in FIG. 4, the nano-particle coat film 6 also has a structure similar to the nano-particle coat film 5. That is, a plurality of hole portions 100 are formed in a surface of the nano-particle coat film 6. The hole portion 100 has an opening portion (a third opening portion) 101C and an opening portion (a fourth opening portion) 101D sequentially along a direction (a second direction) 52 directed from the connection terminal 4 to the electrode terminal 2 shown in FIG. 2.

And, in the plurality of hole portions 100 in the surface of the nano-particle coat film 6, the base resin 10 of the conductive resin 7 is hardened in a state of entering the hole portion as shown in FIG. 2. A part of the opening portion 101C shown in FIG. 4 is covered with a bulging portion 102 which is a part of the nano-particle coat film 5. The bulging portion 102 is formed in an opening portion 101D side.

In the first embodiment, by forming the nano-particle coat films both in an electrode terminal 2 side and an connection terminal 4 side, connection reliability can be improved further in comparison with a case in which the nano-particle coat film is formed in one side.

Next, a manufacturing process of the semiconductor apparatus of the first embodiment is described.

First of all, as shown in FIG. 1, the semiconductor device 1 having the electrode terminal 2 formed over the principal surface 1a is prepared. Next, a volatile solvent or paste for example, in which a precious metal (Ag in the first embodiment) nano-particle is dispersed is applied on a surface of the electrode terminal 2. A mean particle diameter of the nano-particle is set to 1 to 50 nm.

Next, the electrode terminal 2 on which the solvent or paste is applied are fired at heating temperature of a range of 200 to 500° C. If this firing processing is performed, fusion between the nano-particles begins at a timing when a protection film formed in advance on a surface of the precious metal nano-particles dispersed in the solvent or the paste is lost the by firing.

And, in a case where the surface of the electrode terminals 2 is composed of material of precious metal or Cu (Au in the first embodiment), the precious metal nano-particle physically in contact with the surface of the electrode terminal 2 begins fusion with the surface of the electrode terminal 2 at the same time. Along with increase in firing processing temperature or elapse of time, fusion progresses, growth of the particle progresses and area of a region in which the surface of the electrode terminal 2 and the precious metal nano-particle are fused increases.

Here, in performing of the firing processing, since an active pressure processing is not performed, the nano-particle coat film 5 is not densified even if the fusion between the precious metal nano-particles progresses along with increase in the firing processing temperature or elapse of time.

And therefore, as shown in FIG. 3, the surface of the nano-particle coat film 5 after firing is in a porous state in which a plurality of hole portions 100 including the opening portion (the first opening portion) 101A and the opening portion (the second opening portion) 101B sequentially along the direction (the first direction) 51 directed from the electrode terminal 2 to the connection terminal 4 and having the bulging portion 102 covering the opening portion 101A formed therein are formed.

And, a connection surface between the nano-particle coat film 5 after firing and the surface of the electrode terminals 2 functioning as a base is in a state of partially metal-joined.

On the other hand, also on the surface of the connection terminal 4 shown in FIG. 1, in the same manner as in the electrode terminal 2 side, a volatile solvent or paste for example, in which a precious metal (Ag in the first embodiment) nano-particle is dispersed is applied, and then the connection terminal 4 is fired at heating temperature in a range of 200 to 500° C.

As shown in FIG. 4, the surface of the nano-particle coat film 6 after firing is in a porous state in which a plurality of hole portions 100 including an opening portion (a third opening portion) 101C and an opening portion (a fourth opening portion) 101D sequentially along a direction (a second direction) 52 directed from the connection terminal 4 to the electrode terminal 2 and having the bulging portion 102 covering the opening portion 101C formed therein are formed.

After forming the above described nano-particle coat films 5 and 6 in advance, the nano-particle coat film 5 and the nano-particle coat film 6 are joined by conductive resin 7 shown in FIG. 1. In the joining processing, first of all, the conductive resin 7 in a form of paste is supplied and applied to the nano-particle coat film 6 by a dispenser.

In the conductive resin 7, an Ag particle having a mean particle diameter of 0.5 to 40 μm is mixed in advance by a rate of 65 to 98 wt %.

Next, the semiconductor device 1 on which the nano-particle coat film 5 is formed on the electrode terminal 2 is mounted on the wiring substrate 3 on which the connection terminal 4 is formed. In the mounting processing, the semiconductor device 1 is mounted by pressing in a state in which the electrode terminal 2 is opposed to the connection terminal 4 corresponding thereto.

And, the conductive resin 7 is subjected to a preliminary hardening processing at 100 to 200° C. By performing a hardening baking processing after the paste-like conductive resin 7 is applied, liquid resin having high fluidity enters the hole portion 100 of the porous nano-particle coat films 5 and 6, and the Ag particle having conductivity is mounted so as to contact with the nano-particle coat films 5 and 6 and in an overlapping manner.

Next, underfill resin 8 of insulation is filled between the wiring substrate and the semiconductor device utilizing a capillary phenomenon, and a hardening processing is performed at temperature of 150 to 200° C. In this processing, main hardening of the conductive resin 7 also progresses at the same time, the Ag particles in the conductive resin are pressed against with each other by hardening shrinkage of the resin so that contact is established and electrical conduction and heat dissipation capacity are ensured.

The underfill resin 8 includes an inorganic insulating filler and is adjusted so that a thermal expansion rate thereof is equal to or smaller than 70 ppm/° C.

If the conductive resin 7 is subjected to hardening baking, the base resin 10 is hardened and shrinks. Since the base resin 10 is hardened in a state of entering the hole portion 100 of the porous nano-particle coat films 5 and 6, interface strength thereof is enhanced because of mechanical anchor effect.

Along with hardening and shrinkage of the resin, solidification of the conductive Ag particle progresses in a state in which the particle is pressed against a surface of the nano-particle coat by the resin. Conduction is ensured by contact between the conductive particles or between the conductive particle and the nano-particle coat film, and conductions between the nano-particle coat film 5 and the surface of the electrode terminal 2 and between the nano-particle coat film 6 and the surface of the connection terminal 4 are ensured by metal joint.

In the first embodiment, by forming the porous nano-particle coat films 5 and 6 on the electrode terminal 2 and the connection terminal 4 in advance, the anchor effect of the conductive resin 7 can be obtained. Because of the anchor effect, joint strength between the conductive resin 7 and the electrode terminal 2 and the connection terminal 4 is improved. Even in a thermal cycling environment deteriorating the joint strength, progress of exfoliation of the joint interface can be suppressed, and a connection structure of the conductive resin and metal having high reliability can be provided.

And, the connection structure of joining the Au connection terminal 4 of the wiring substrate 3 and the projection-like Au electrode terminal 2 of the semiconductor device by the conductive resin 7 is changed from the joint interface of an flat Au terminal and the conductive resin 7 having lowest strength to the joint interface of the well-roughened Ag nano-particle coat film and the conductive resin 7. And therefore, the joint strength can be improved by change of the material combination.

Because of employing the connection structure described above for the electrical connection part of the semiconductor apparatus, 260° C. reflow resistance, which cannot be obtained by lead-free soldering, can be obtained, and the lead-free semiconductor apparatus excellent in secondary mounting (mounting the semiconductor apparatus to a printed wiring circuit substrate or the like) property can be provided.

And, since mounting temperature of the semiconductor apparatus can be 200° C. or less, mounting material can be composed of members having low heat resistance property, and therefore, a semiconductor apparatus of a low cost can be provided.

Second Embodiment

In the first embodiment described above, an example applied to a semiconductor apparatus in which a semiconductor device is flip-chip-bonded to a wiring substrate is described. In a second embodiment, an example applied to a semiconductor apparatus in which an electrode formed over a principal surface of a semiconductor device is connected by die-bonding is described.

Figure 5:
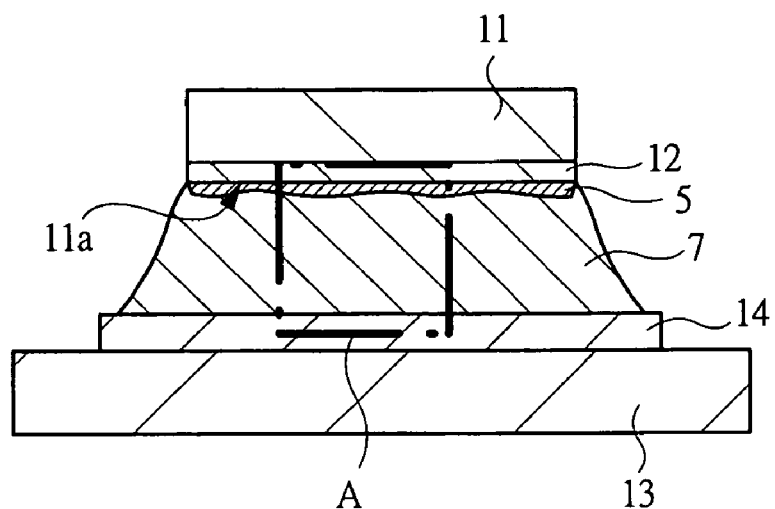
FIG. 5 is a cross sectional view showing a state in which a vertical semiconductor device of a second embodiment of the present invention is die-bonded to a die pad.
Figure 6:
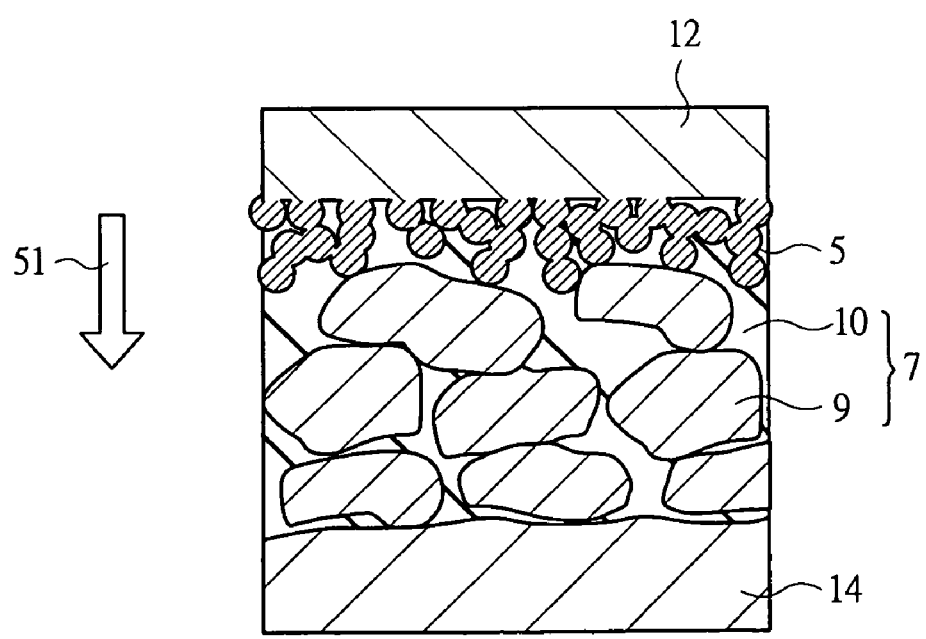
FIG. 6 is an enlarged cross sectional view of a region surrounded by a chain line A shown in FIG. 5.

FIG. 5 is a cross sectional view showing a state in which a vertical semiconductor device of the second embodiment is die-bonded to a die pad, and FIG. 6 is an enlarged cross sectional view enlarging area surrounded by a chain line A shown in FIG. 5.

In FIG. 5, in a region of a die pad (a metal member, a first metal member) 13 on which a semiconductor device 11 is mounted, an Ag plating film 14 having a thickness of 5 to 10 µm is formed. On the other hand, on one principal surface (a first principal surface) 11a of the vertical semiconductor device 11, a metal multilayer film of Ti/Ni/Au is formed as a metal electrode (a first electrode) 12.

An Au film of a surface layer of the metal electrode 12 is formed to have a thickness of 100 nm to 5 µm. If the Au film is thinner than 100 nm, underlying Ni appears on a surface of the Au film because of diffusion, and therefore, increase in electrical resistance or deterioration in connection strength occurs in a joint interface. And, increasing the thickness more than 5 µm is not practical since the property is not changed and increase in cost is caused only.

On a surface of the metal electrode 12, a porous Ag nano-particle coat film 5 obtained by applying an Ag nano-particle and firing is formed in the same manner as the nano-particle coat film 5 shown in FIG. 2 and FIG. 3 described in the first embodiment. The firing is performed using an Ag nano-particle having a mean particle diameter of 1 to 50 nm.

If the size of the Ag nano-particle exceeds 50 nm in the mean particle diameter, since a characteristic that the particles fuse upon firing is deteriorated, cohesiveness with the Au metal electrode 12 after firing is deteriorated. And therefore, exfoliation occurs between the nano-particle coat film 5 and the Au rear surface electrode in a case where they are jointed by conductive resin, as a result, reliability is adversely deteriorated.

If the mean particle diameter of the Ag nano-particle is smaller than 1 nm, a manufacturing cost of the material increases, and, furthermore, the processing is difficult in actually since agglomeration tends to occur under room temperature storage conditions.

In order to prevent the agglomeration during storage, an organic protective film is formed on a surface of the Ag nano-particle, and is used by subjecting to a dispersion processing by mixing with a solvent having property that it vaporizes and is lost by heating. In application to the metal electrode 12, it is applied to the device rear surface in a state of a solvent or paste.

As the solvent, toluene, alcohol or pure water having good dispersibility of the Ag nano-particle is used. However, another solvent can be used as long as it has property that it is lost by heating. And, as the application method, any of an immersion method, a spin coat method, a printing method, a dispense method and an ink-jet method can be employed. A suitable method can be selected in accordance with viscosity of the dispersion processing liquid or an application pattern.

In the second embodiment, the spin coat method is used in order to form a thin coat film on an entire rear surface in a state of a wafer. As firing, a heating processing is performed at 350° C. for one hour. The heating temperature is set in accordance with decomposition disappearance temperature of the protective film of the Ag nano-particle. In a case of a polymeric protective film, it is preferably set in a temperature range of 300 to 500° C., and in a case of a low-molecular protective film, it is preferably set in a temperature range of 200 to 400° C.

As shown in FIG. 6, on an Au film of a surface layer of the metal electrode 12, a nano-particle coat film 5 formed by fusion of Ag nano-particles is formed in a state metal-bonded with the Au film. The nano-particle coat film 5 is porous and joined in a state that base resin 10 of conductive resin 7 flows in a hole portion thereof.

An Ag particle 9 of the conductive resin 7 and the nano-particle coat film 5 are joined in a mechanically contacting state, and they are not metal-bonded. And, the Ag particle 9 in the conductive resin 7 is also bonded with each other in a contacting state, and heat and electricity is transmitted via conductive particles by proximity effect.

This connection structure is obtained by forming the nano-particle coat film 5 (film subjected to a firing processing before assembling process) in advance on the surface of the metal electrode 12 of the semiconductor device 11, and details thereof are described later.

In the second embodiment, since the metal electrode 12 of the semiconductor device 11 and the nano-particle coat film 5 are metal-bonded with each other, cohesiveness strength thereof is sufficiently high. And, a network in which the nano-particles are mutually fused and metal-bonded is formed in the nano-particle coat film 5, accordingly, a strong structure is obtained.

And, the interface between the nano-particle coat film 5 and the conductive resin 7 has a mechanically-bonded state in which the base resin 10 of the conductive resin 7 enters the interior of the nano-particle coat film 5, accordingly, joint strength thereof is high, and a structure in which strength of the conductive resin 7 is obtained as strength of the connection portion is achieved.

And therefore, stable joint strength is obtained at the joint portion of the conductive resin. As a result, a highly reliable coupling structure can be obtained, and effect that reliability of a semiconductor product can be ensured is obtained.

The nano-particle coat film 5 is formed so as to have a thickness in a range of 50 nm to 3 µm in average after firing. By forming to have a thickness of 50 nm or more, improving effect of joint property with the resin is obtained. If it is formed to have a thickness more than 3 µm, the joint property is not changed, and merely the cost is increased. And therefore, is not practical.

By observing the nano-particle coat film 5 formed under the above described condition by an electron microscope at magnification of several thousand to several ten-thousands of time, it can be recognized that noticeable convexes and concaves are formed on the surface, and portions forming joint parts having a structure in which the conductive resin and the film are not mechanically detached from each other even when exfoliation occurs in the joint interface with the conductive resin are formed at a predetermined density (the joint part means a part in which a convex part has a shape tapering toward a base and a concave part has a shape which is small at inlet and wide at interior).

In other words, the hole portion 100 described in the first embodiment and shown in FIG. 3 or FIG. 4 are also formed in the nano-particle coat film 5 of the second embodiment. And, the hole portion 100 has the first opening portion 101A and the second opening portion 101B sequentially along a first direction 51 directed from the metal electrode 12 to the die pad 13, and the bulging portion 102 covering the first opening portion 101A is formed. The bulging portion 102 is composed of the Ag nano-particle constituting the nano-particle coat film.

Figure 17:
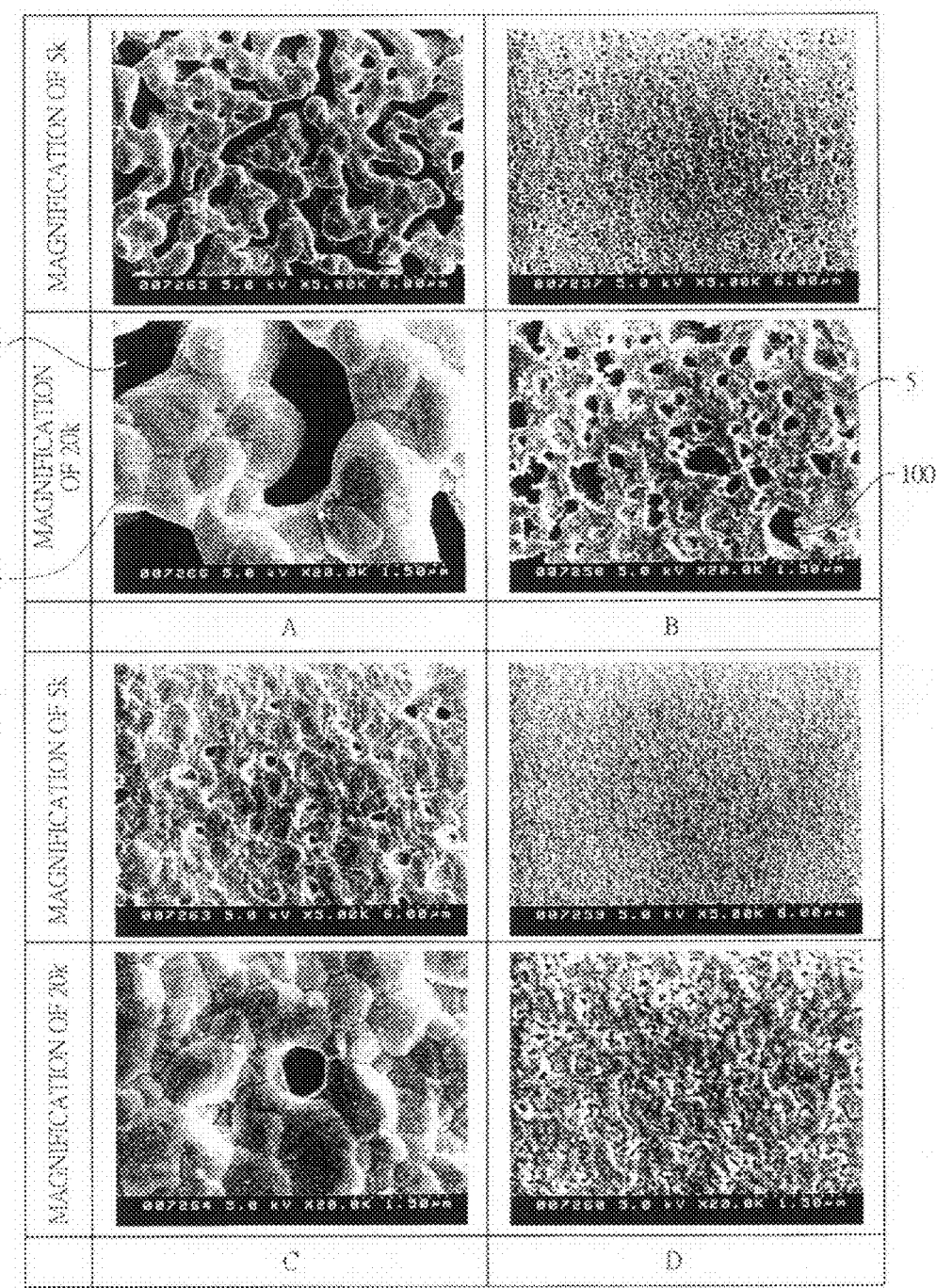
FIG. 17 is an explanatory diagram showing states of a surface of a nano-particle coat film enlarged at magnifications of 5000 and 20000 times respectively and observed by an electron microscope.

A surface state of the nano-particle coat film is described using FIG. 17. FIG. 17 is an explanatory diagram showing a state of the surface of the nano-particle coat film enlarged at magnifications of 5000 and 20000 times respectively and observed by an electron microscope.

In FIG. 17, A shows a case in which firing is performed at 250° C. using an Ag nano-particle including a silver oxide and B shows a case in which firing is performed at 350° C. using an Ag nano-particle on which an amine-based protective film is formed and which has a wide (about several nm to several hundreds of nm) particle level distribution (distribution of particle diameter of nano-particles). Note that the mean particle diameter is set to several tens of nm in the case of B.

And, C shows a case in which firing is performed at 200° C. using an organic silver compound (compound in which an Ag ion adheres to an organic matter molecule) used in nano-particle formation. D shows a case in which firing is performed at 400° C. using only an Ag nano-particle having particle level distribution of about several nm to several tens of nm particularly centering around 10 nm and having a protective film with high decomposition temperature formed.

By comparing with the surface state of the Au vapor-deposited film of the surface layer of the metal electrode 12 shown in FIG. 5, it is recognized that noticeable convexes and concaves are formed on the surface in all cases of A to D shown in FIG. 17. And, a degree of porousness (degree of formation of the above described joint parts) of the nano-particle coat film is high particularly in the cases of A and B, and it is found out that cohesiveness strength with resin in the interface can be enhanced by the anchor effect.

Below two reasons are conceivable as reasons that the film obtained by coating a nano-particle and firing becomes porous. The first reason is that, when a solution in which a nano-particle is dispersed in a solvent is applied and dried, open-type hollow (hole portion) is formed in the film in a processing that the solvent vapors and diffuses from interior of the nano-particle coat film.

The second reason is that, although the adjacent Ag nano-particles are mutually fused and integrated in the firing processing, movement distance of the nano-particle itself is limited since it is a phenomenon in a solid-phase state, and it is changed to a stable and strong film with approximately holding a state of a hollow structure formed at application and a dry processing.

And, as a reason that the degree of porousness is high in the case of A, it is considered that reduction/decay processings of silver oxide and a metal fusion processing of a fine Ag particle formed at the reduction/decay processing cause formation of a net-like structure.

And as a reason that the degree of porousness is high in the case of B is that numerous fine hole portions are formed since particle level distribution of diameter of the nano-particles is widened, such as several nm to several hundreds of nm.

The wafer on which the nano-particle coat film 5 is formed is cut into chip pieces by dicing and used in die-bonding. In FIG. 6, the Ag nano-particle coat film 5 have numerous open hole portions formed in interior or a surface thereof and joined with the metal electrode 12 having a Au layer formed in a surface layer of a base, by Au/Ag metal-bonding at a predetermined area rate (the predetermined area rate mentioned herein means a rate equal to or more than a minimum area rate at which the metal-bonding part is not broken by a tensile test in a case where the Ag nano-particle coat film 5 is joined with the conductive resin 7).

The Ag plating film 14 of a surface of the die pad 13 and the nano-particle coat film 5 are joined by the conductive resin 7. As shown in FIG. 6, the conductive resin 7 is composed of the Ag particle 9 and the base resin 10 which is an organic binder. The particle size (longest length in a longitudinal direction) of the Ag particle 9 is 0.5 to 50 µm. A content of the Ag particle 9 mixed in the conductive resin 7 is 65 to 98 wt %.

As a connection method of the semiconductor device 11 and the die pad 13, the conductive resin 7 including the Ag particles 9 is applied onto the Ag plating film 14 formed on the surface of the die pad 13, the device with the metal electrode 12 in the lower side is placed thereon and subjected to scrubbing, it is pressed until the conductive resin 7 protrudes from periphery of the semiconductor device 11, the load is then released, and it is subjected to a hardening and baking processing. As a result, a die-bonding structure of the die pad on which the metal electrode 12, the nano-particle coat film 5, the conductive resin 7 including the Ag particle 9 and the Ag plating film 14 are formed is obtained.

Figure 7:
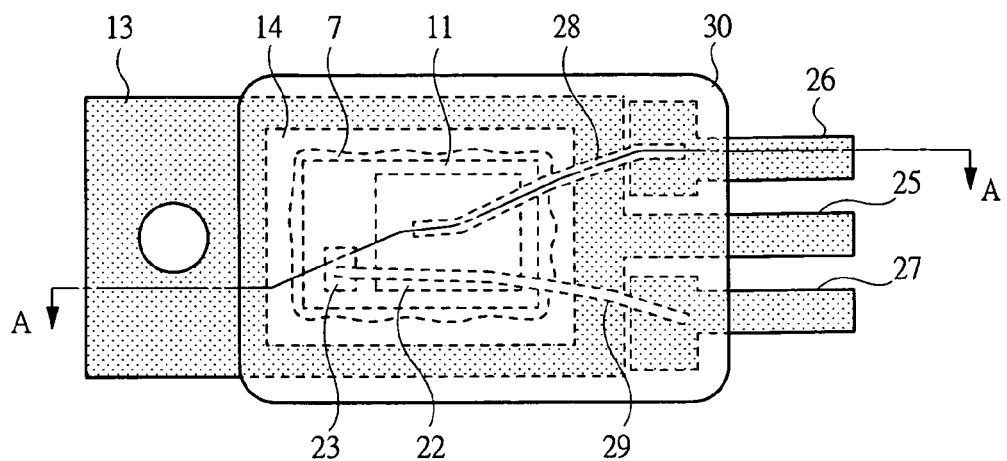
FIG. 7 is a plan view showing a vertical semiconductor apparatus according to the present invention to which a connection structure shown in FIG. 5 is applied.

Next, a semiconductor apparatus to which the connection structure of the second embodiment shown in FIG. 5 is applied is described. FIG. 7 is a plan view showing a vertical semiconductor apparatus according to the present invention to which the connection structure shown in FIG. 5 is applied, and FIG. 8 is a cross sectional view taken along a line A-A of the vertical semiconductor apparatus shown in FIG. 7.

Figure 8:
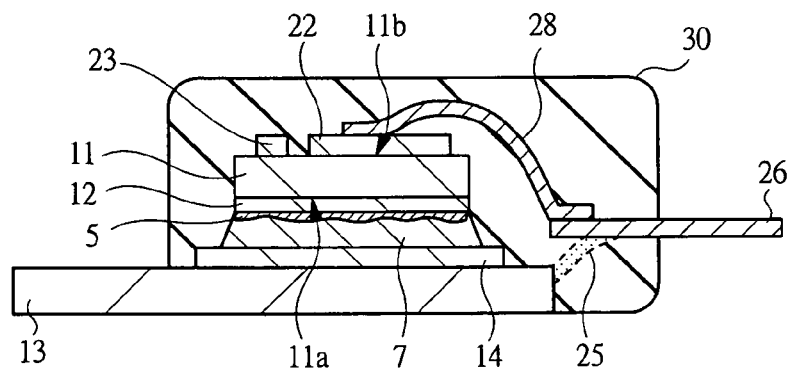
FIG. 8 is a cross sectional view taken along a line A-A of the vertical semiconductor apparatus shown in FIG. 7.

In FIG. 8, the metal electrode 12 having a multilayer structure, in which an uppermost surface is Au, is formed on a rear surface of the semiconductor device 11, and a source electrode 22 and a gate electrode 23 composed of an Al (aluminum) film are formed in a circuit formation surface side.

On the metal electrode 12 having the uppermost surface of Au, a porous Ag nano-particle coat film 5 having a thickness of 50 nm to 3 µm formed by applying and firing an Ag nano-particle is formed. In a semiconductor device mounting region of the die pad 13 of a Cu lead frame, the Ag plating film 14 having a thickness of 0.5 to 10 µm is formed. The part between the Ag plating surface and the Ag nano-particle coat film on the rear surface electrode is filled with the conductive resin 7 in which a thermohardening resin includes an Ag particle by 65 to 98 wt %, and the semiconductor device 11 and the die pad 13 are joined.

Between the source electrode 22 of the semiconductor device 11 and a source lead 26 of the lead frame and between the gate electrode 23 and a gate lead 27 are electrically wired by Al (aluminum) wires 28 and 29, respectively.

Molding (enclosing) is performed by an insulating mold resin (encapsulant) 30 so that a part of respective leads including a drain lead 25, a part of the die pad and the entirety of the semiconductor device and the Al (aluminum) wires 28 and 29 are covered.

The vertical semiconductor apparatus of the second embodiment and a vertical semiconductor apparatus in which the nano-particle coat film is not formed are subjected to a moisture absorption processing by exposing them in an environment having temperature of 85° C. and humidity of 85% for 168 hours, a 260° C. reflow processing for three times, and a thermal cycling test of −55/150° C. After that, reliability of the semiconductor apparatus is estimated.

A variation rate of a heat dissipation characteristic of the semiconductor device at thermal cycling of 500 times is smaller in the vertical semiconductor apparatus of the second embodiment than that of the vertical semiconductor apparatus in which the nano-particle coat film is not formed. And, by cross section observation thereof, it is confirmed that in the joint part of the conductive resin 7 having the nano-particle coat film 5 formed, a crack grows in the conductive resin 7 and exfoliation mainly occurs in an interface between the Ag particle and the resin. And, in the joint part of the conductive resin in which the nano-particle coat film is not formed; a rate that crack grows in the interface between the conductive resin and the Au metal electrode is high.

In a case where a variation rate 30% of the thermal characteristic is used as an indication of reliability life, the life of the semiconductor apparatus of the second embodiment is 700 times or more that is longer than 500 times of the semiconductor apparatus in which the nano-particle coat film is not formed. And it is confirmed that the life of the vertical semiconductor apparatus is affected by a growth route of the crack.

According to the second embodiment, by employing a structure in which the Ag nano-particle coat film 5 is formed on the Au metal electrode 12 of the semiconductor device 11 and bonding is performed by the conductive resin 7, the joint strength of the interface between the metal electrode 12 and the conductive resin 7 can be improved.

Moreover, even if it is exposed to a harsh environment such as a combination of moisture absorption and reflow or a thermal cycling, occurrence of exfoliation in the joint interface between the metal electrode 12 and the conductive resin 7 is eliminated, and therefore, reliability of the semiconductor apparatus can be improved. And, a die-bonding member (joint member) can be lead-free.

And, since high-temperature solder is not used as a die-bonding member, temperature of an assembling process of the semiconductor apparatus can be lowered. Since the assembling process can be performed in atmosphere, manufacturing cost can be reduced, and therefore, a low-cost semiconductor apparatus can be provided.

Figure 18:
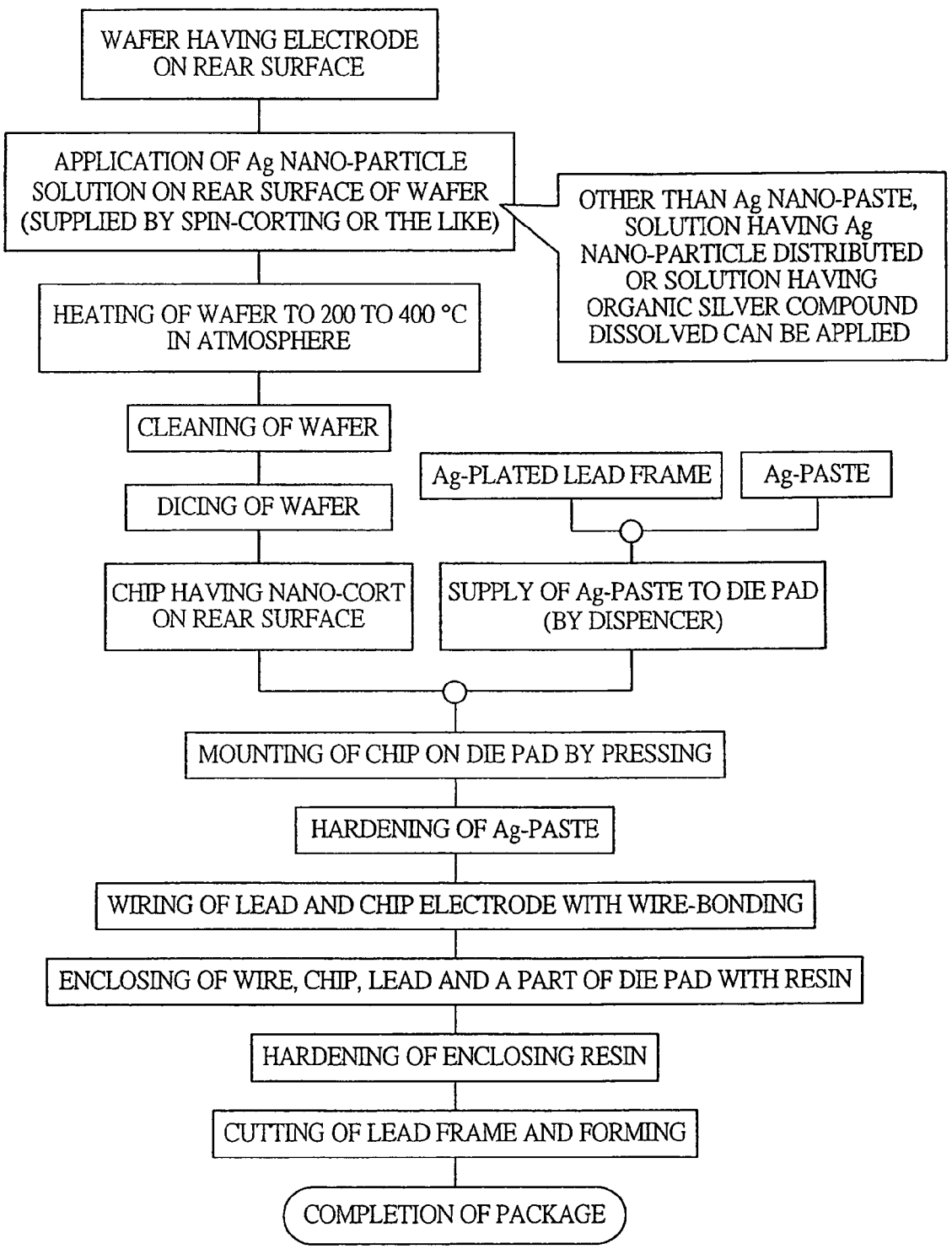
FIG. 18 is an explanatory diagram showing an example of an assembling process of the semiconductor apparatus of the second embodiment of the present invention.

Next, a manufacturing process of the semiconductor apparatus of the second embodiment is described. FIG. 18 is an explanatory diagram showing an example of an assembling process of the semiconductor apparatus of the second embodiment.

The semiconductor device 11 of the second embodiment is subjected to this process in a state of a wafer in which manufacturing is performed up to formation of the metal electrode 12 in a rear surface side (a state before individually separated into chips).

(a) First of all, on a surface of the metal electrode 12 formed on the rear surface of the wafer, a thin film of the Ag nano-particle solution uniformly dispersed in a solvent is applied, for example, by a spin-coating method.

As the application method, an immersion method is preferable in a case where upper and rear surfaces are to be coated at the same time, a method of printing highly-viscous paste is preferred in a case where a thick film is to be formed, and an ink-jet method is preferred in a case where the film is to be partially formed or formed in a pattern. The application method can be arbitrarily selected in accordance with an object or a state of the solution;

After the application, a volatile component is vaporized and dried, and then the wafer is heated in atmosphere to temperature of 200 to 400° C. and kept for about 1 to 120 minutes, thereby performing firing. The temperature and time in this processing is arbitrarily selected in accordance with property of used Ag nano-particle or organic silver compound. The firing temperature is desired to be as low as possible in a range where the metal bonding between the nano-particle coat film and the base rear surface electrode can be achieved and sufficient cohesive strength can be obtained.

After the firing, the wafer is subjected to a cleaning processing, attached to a dicing tape, cut into size of the semiconductor device 11 and provided to an assembling process of a package as a chip. In other words, in the second embodiment, after the Ag nano-particle solution is applied, firing is performed before mounting the device to the lead frame.

By applying the paste or dispersion solution of the nano-particle and firing the device in atmosphere, an organic component (a binder, solvent, and a protective film) in the applied film is reacted with surrounding oxigen and readily lost from periphery of the nano-particle, and therefore, reliable contact between metal is established. As a result, metal bonding in an Au film of the metal electrode 12 which is a base and between the nano-particles are achieved, and a nano-particle coat film 5 which is strong and has high cohesiveness can be obtained.

Here, in a case where the conductive resin 7 is further applied and both of them are heated at the same time so as to perform a firing/hardening processing before forming the applied film of the nano-particle and firing the applied film of the nano-particle, the base resin 10 of the conductive resin 7 that does not disappear enters peripheries of the nano-particle. And therefore, contact between the nano-particles or between the nano-particle and the Au film which is a base cannot be ensured, as a result, formation of strong nano-particle coat film 5 having high cohesiveness becomes difficult.

And, there is a problem that escaping space for the volatile or decomposed gas generated from the nano-particle applied film is lost, defects such as voids are generated between the conductive resin 7 and the nano-particle coat film and joint force between them is reduced.

(b) Next, the lead frame and the Ag paste which is the conductive resin are prepared. The lead frame made of Cu is subjected to this process in a state in which a chip mounting surface is plated by Ag. And, the Ag paste is used in this process in a state in which it is in a syringe.

(c) Next, an assembling process is described. First of all, the Ag paste is supplied by a dispenser onto a die pad surface (a chip mounting surface) of the lead frame prepared in the step (b).

Next, a nano-coating processing is performed to the rear surface fabricated in the step (a), and the semiconductor device 11 having a nano-particle coat film 5 formed is mounted by pressing itself against the Ag paste. A hardening processing is performed at temperature of 150 to 250° C. in a bake furnace, and die-bonding is performed.

And thereafter, a control electrode and a main current electrode on the semiconductor device 11 are wired with respective internal connection terminals of the lead frame for external connection by wire-bonding. Then, they are set in a mold in a unit of lead frame and molded by the mold resin 30 so that the entirety of the wires and the chip and a part of the lead frame including the die pad are covered, and the mold resin 30 is subjected to a hardening processing at predetermined temperature.

At the end, a part of the lead projecting from the mold resin 30 is cut/shaped, and the device is completed as the semiconductor apparatus shown in FIG. 8. The completed product of the semiconductor apparatus is subjected to solder plating in accordance with needs.

Since the semiconductor apparatus of the second embodiment is assembled after the nano-particle coat film 5 is formed in advance on a surface of the metal electrode 12 of the semiconductor device 11 as described above, a structure as shown in FIG. 6 is obtained. That is, a structure in which hardening and joint is performed in a state that the base resin 10 of the conductive resin 7 flows in numerous hole portions formed in the nano-particle coat film 5 is obtained.

In the connection structure in which hardening and joint is performed in a state that the base resin 10 flows into the nano-particle coat film 5 described above, the anchor effect of the hardened base resin 10 can be obtained. And therefore, in a case where the semiconductor device 11 is joined with the die pad portion of the lead frame plated by Ag via the conductive resin 7, joint strength of the interface between the semiconductor device 11 and the conductive resin 7 can be improved.

And therefore, in a thermal cycling test or a high-temperature high-humidity test, generation of a defective mode in which exfoliation occurs in the interface between the rear surface of the semiconductor device 11 and the conductive resin 7 can be prevented. Moreover, since a countermeasure for a rupture mode in which a crack grows in a conductive resin layer can be taken, variation in life of semiconductor packages can be reduced. As a result, reliability of the product can be stably-ensured.

Figure 19:
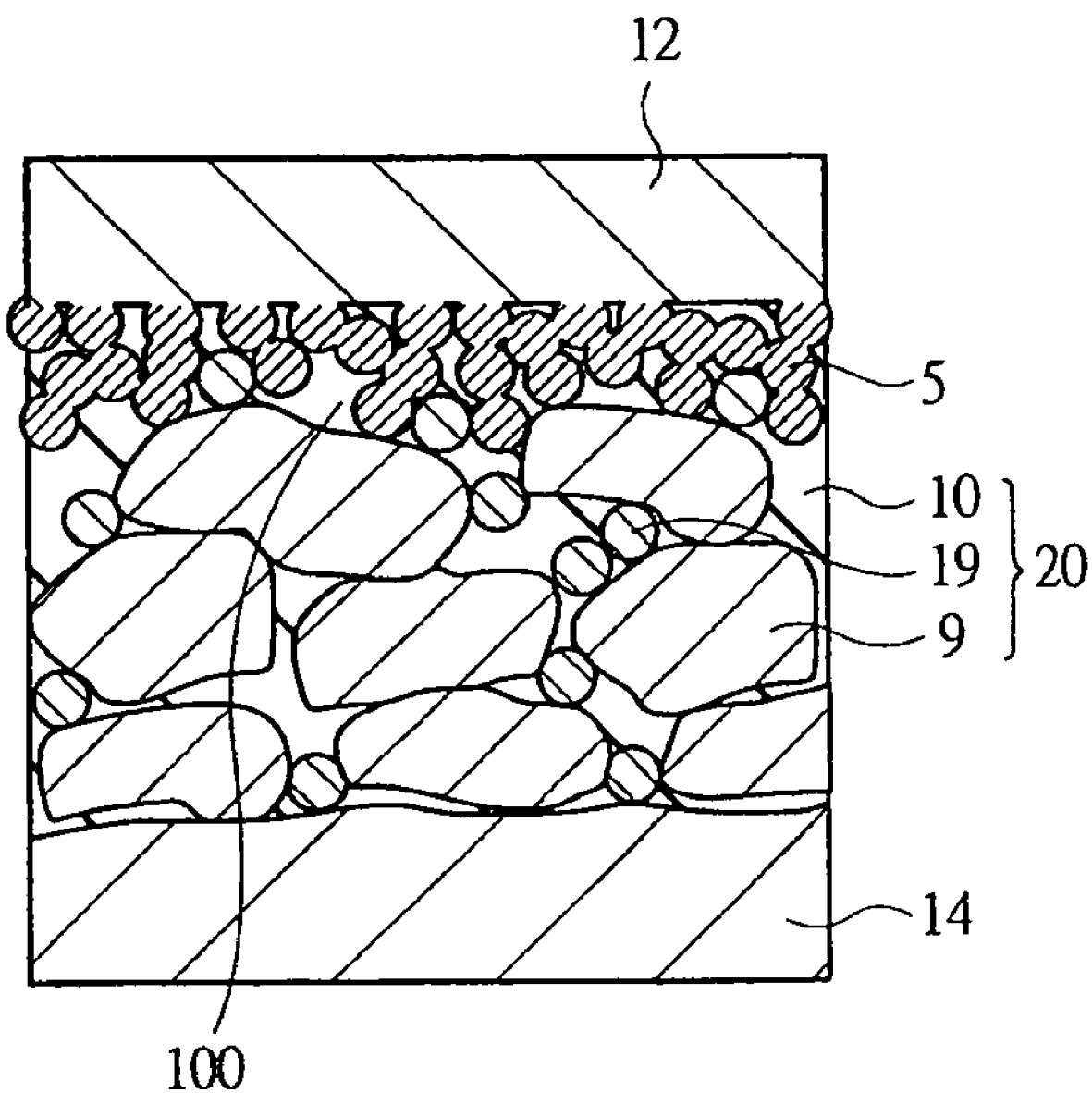
FIG. 19 is an enlarged cross sectional view showing a connection structure of a semiconductor device and conductive resin in a semiconductor apparatus of a modification example of the second embodiment of the present invention.

As a modification example of the second embodiment, an example in which a conductive particle which is ultrafine further than the Ag particle 9 is mixed in the conductive resin 7 is described. FIG. 19 is an enlarged cross sectional view showing a connection structure of the semiconductor device and the conductive resin of the semiconductor apparatus which is the modification example of the second embodiment.

In FIG. 19, a bonding state between the nano-particle coat film 5 and a composite conductive resin 20 is same as a case shown in FIG. 6. However, the ultrafine conductive particle 19 enters the hole portion 100 of the conductive particle 19 and the nano-particle coat film 5 and between the Ag particles 9. Although the conductive particles 19 are not metal-bonded with the nano-particle coat film 5 and the Ag particle 9 and are in a contact state, numerous conduction routes by proximity effect are formed. And therefore, a connection structure having a conductive characteristic further improved compared with the connection structure described in FIG. 6 can be obtained.

Third Embodiment

Figure 9:
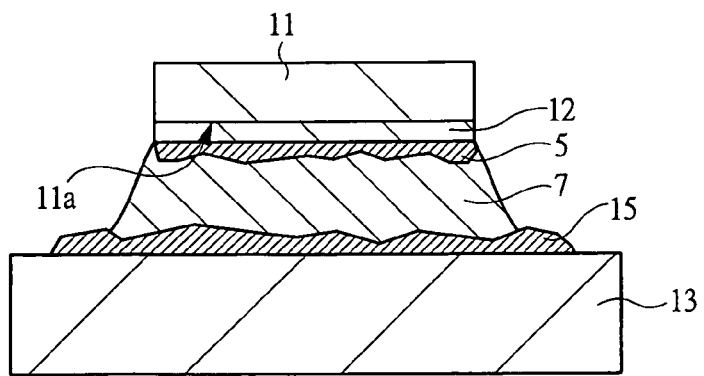
FIG. 9 is a cross sectional view showing a die-bonding structure of a semiconductor device according to a third embodiment of the present invention.

In the second embodiment described above, the example in which the nano-particle coat film is formed on a surface of the electrode of the semiconductor device is described. In the third embodiment, an example in which the nano-particle coat film is formed in a semiconductor device mounting region of a die pad is described. FIG. 9 is a cross sectional view showing a die-bonding structure of a semiconductor device according to the third embodiment.

In FIG. 9, in a region of the die pad 13 composed of Cu for mounting the semiconductor device 11, a nano-particle coat film (a second precious metal layer) 15 composed of a Ag nano-particle having a thickness of 0.1 to 5 μm is directly formed on the surface of the die pad 13.

If a thickness of the nano-particle coat film 15 is smaller than 0.1 μm, Cu of the base is diffused in a heating processing in coat film formation and exposed on a surface of the coat film. Accordingly, electric resistance may be increased in the joint interface with the conductive resin 7 because of oxidation of Cu, and power loss of the semiconductor apparatus may be increased. On the other hand, if the thickness of the nano-particle coat film 15 is increased more than 5 μm, a usage amount of the Ag nano-particle is increased, thereby leading to increase in cost. This is not practical.

And, in the same way as the structure described in the above described second embodiment using FIG. 5 and FIG. 7, the nano-particle coat film 5 is formed on the surface of the metal electrode 12 of the semiconductor device 11. As shown in FIG. 9, the nano-particle coat film 5 and the nano-particle coat film 15 are electrically connected to each other via the conductive resin 7.

Figure 10:
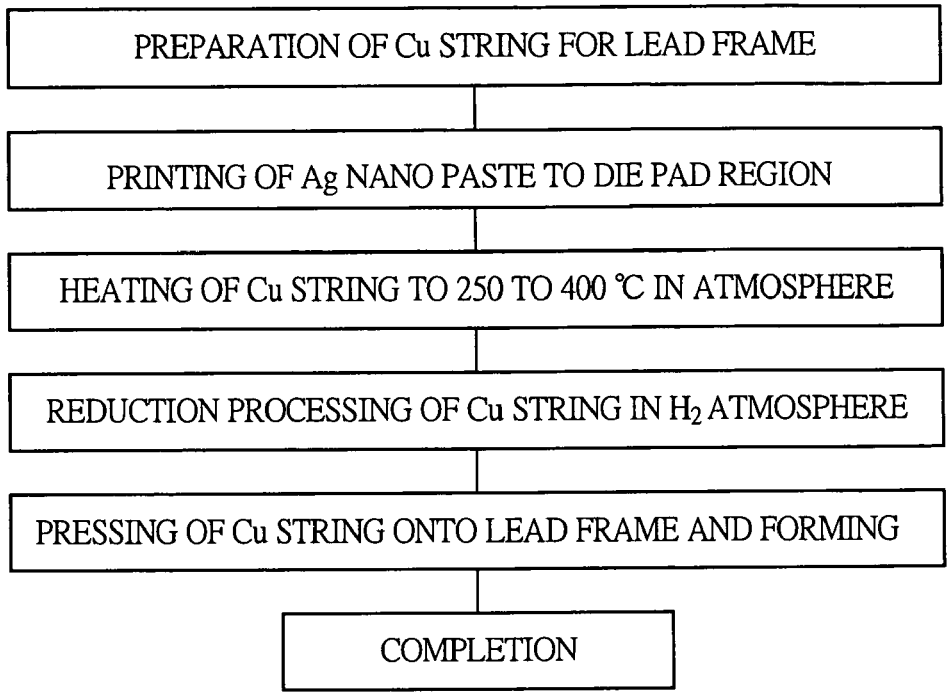
FIG. 10 is an explanatory diagram showing an example of a method of forming an Ag nano-particle coat film on a die pad of a lead frame.

Next, a method of forming the nano-particle coat film 15 on the die pad 13 is described. FIG. 10 is an explanatory diagram showing an example of a method of forming the Ag nano-particle coat film on the die pad of the lead frame.

First of all, the Ag nano paste having viscosity adjusted (the paste undergone disperse processing of Ag nano-particles described in the above described first embodiment and the second embodiment) is printed on a position to be the die pad of a Cu string extended by pressure application and subjected to a firing processing by heating at 250 to 400° C. in atmosphere.

Next, after the Cu string is cleaned, a reduction processing of oxidized Cu is performed by heating at 400° C. in a reduction atmosphere.

Thereafter, a pressing processing and a forming processing are performed, and a lead frame in which the Ag nano-particle coat film is formed is completed. A surface state of the nano-particle coat film 15 formed on the die pad 13 of the completed lead frame has a structure similar to that of the nano-particle coat film 6 shown in FIG. 4 described in the first embodiment.

That is, a plurality of hole portions 100 is formed on the surface of the nano-particle coat film 15. The hole portion 100 sequentially has an opening portion (a third opening portion) 101C and an opening portion (a fourth opening portion) 101D as shown in FIG. 4 along a direction (a second direction) from the die pad 13 to the metal electrode 12 shown in FIG. 19.

And, in the plurality of hole portions 100 in the surface of the nano-particle coat film 15, the base resin 10 of the conductive resin 7 is hardened in a state of entering thereinto. A part of the opening portion 101C is covered with the bulging portion 102 which is a part of the nano-particle coat film 15. The bulging portion 102 is formed in a opening portion 101D side.

Note that, detailed description of processings of the pressing processing and the forming processing is omitted since they can be performed in the same manner with that of processings of a general lead frame.

According to the third embodiment, since the nano-particle coat film 15 is formed on the surface of the die pad 13 of the lead frame in addition to the surface of the metal electrode 12 of the semiconductor device 11, connection reliability of the connection interface between the die pad 13 and the conductive resin 7 can be improved more than that of the semiconductor apparatus described in the second embodiment.

That is, even if it is exposed to a high-temperature/high-humidity environment or an environment in which thermal stress is applied, exfoliation of the joint interface with the conductive resin 7 does not occur. And, even if crack is generated in the die-bonding portion, growth speed thereof is not rapid since the crack is limited in the conductive resin layer. And, since growth of the crack can be suppressed to a minimum level by optimization of the structure, a highly-reliable semiconductor apparatus can be provided.

Moreover, since a plating processing can be omitted in the manufacturing processings of the lead frame, and the lead frame can be fabricated by a dry processing which produces no plating waste liquid, there is an advantage that an environmental load can be reduced.

Fourth Embodiment

Figure 11:
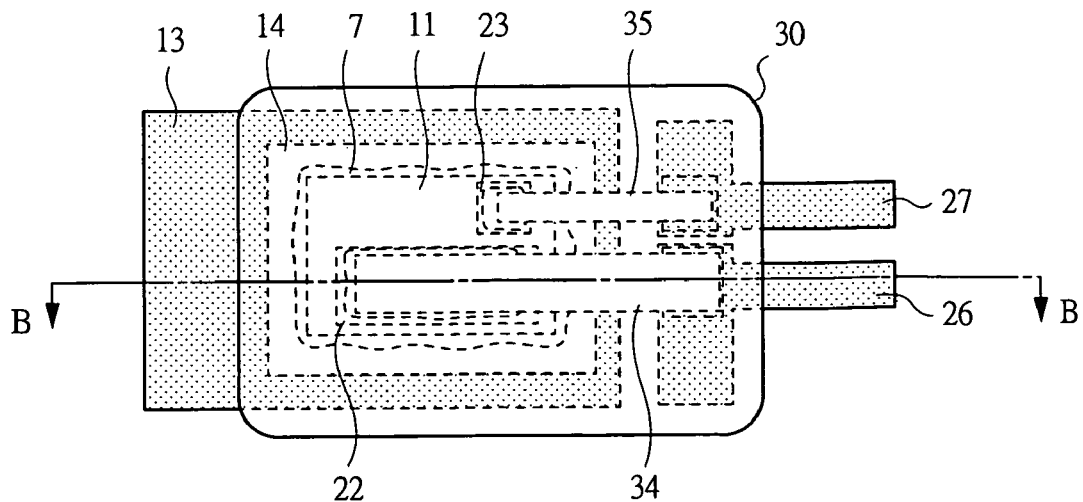
FIG. 11 is a plan view showing a vertical semiconductor apparatus of a conductive resin joint type of a fourth embodiment of the present invention.

In a fourth embodiment, an example applied to a semiconductor apparatus of a type in which a rear surface electrode of a vertical semiconductor device and an electrode formed on a principal surface which is in an opposite side of the rear surface electrode is connected by lead is described. FIG. 11 is a plan view showing the vertical semiconductor apparatus of a conductive resin joint type of the fourth embodiment, FIG. 12 is a cross sectional view taken along a line B-B shown in FIG. 11, and FIG. 13 is an enlarged cross sectional view showing a state of a region surrounded by a chain line D shown in FIG. 12 before joint by conductive resin.

Figure 12:
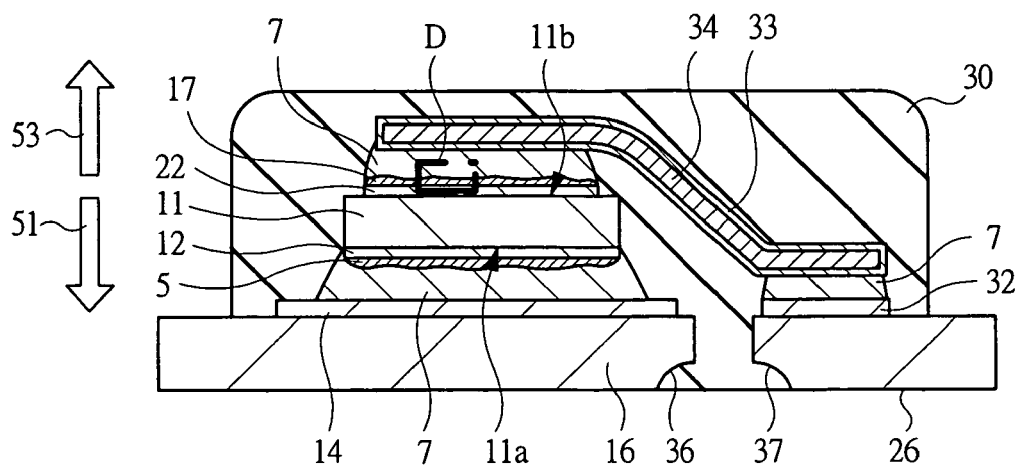
FIG. 12 is a cross sectional view taken along a line B-B shown in FIG. 11.
Figure 13:
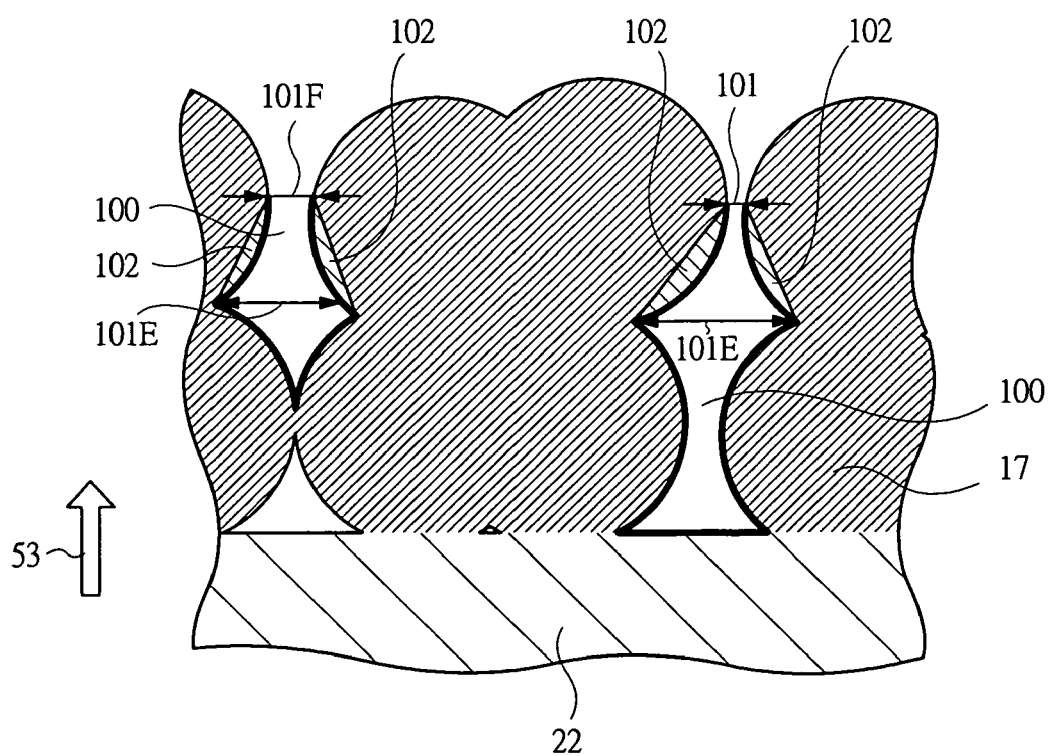
FIG. 13 is an enlarged cross sectional view showing a state of a region surrounded by a chain line D shown in FIG. 12 before jointing by conductive resin.

In FIG. 12, a die pad (a second metal member) 16, which functions also as a drain lead, a source lead 26 and a gate lead 27 (see FIG. 11) are disposed in the same plane. In a region of the die pad 16 for mounting the semiconductor device 11, an Ag plating film 14 having a thickness of 1 to 10 μm is formed. And on surfaces of the source lead 26 and the gate lead 27 in one side shown in FIG. 11, Ag plating films 32 having a thickness of 1 to 10 μm are formed.

On surfaces of a metal electrode 12 functioning as a drain electrode formed in a principal surface 11a-side of the semiconductor device 11 and a source electrode 22 formed in a principal surface 11b-side, Ag nano-particle coat films 5 and 17 are formed, respectively.

In a surface of the nano-particle coat film 5, a plurality of hole portions 100 are formed as shown in FIG. 3. The hole portion 100 sequentially has an opening portion (a first opening portion) 101A and an opening portion (a second opening portion) 101B along a direction (a first direction) 51 directed from the metal electrode 12 to the die pad 16 shown in FIG. 12. Furthermore, in the plurality of hole portions 100 in the surface of the nano-particle coat film 5, base resin of conductive resin 7 is hardened in an entering state.

And, in a surface of the nano-particle coat film 17, a plurality of hole portions 100 are formed as shown in FIG. 13. The hole portion 100 sequentially has an opening portion (a fifth opening portion) 101E and an opening portion (a sixth opening portion) 101F sequentially along a direction (a third direction) 53 directed from the source electrode (a second electrode) 22 to a Cu lead (a second metal member) 34 shown in FIG. 12. And, in the plurality of hole portions 100 in the surface of the nano-particle coat film 17, the base resin of the conductive resin 7 is hardened in an entering state. Furthermore, a part of the opening portion 101E shown in FIG. 13 is covered with a bulging portion 102 which is a part of the nano-particle coat film 17. The bulging portion 102 is formed in an opening portion 101F side.

As described in the first to the third embodiments, also in the present embodiment, by forming the bulging portion 102, the base resin of the conductive resin 7 after hardening has a function as an anchor, and therefore, exfoliation between the conductive resin 7 and the metal electrode 12 or the source electrode 22 can be suppressed.

An uppermost surface of the metal electrode 12 is a precious metal vapor-deposited film of Au or Ag. And, the source electrode 22 has a multilayer structure in which a plating film of Ni/Au or a vapor deposited film of Ti/Ni/Au or Ti/Ni/Ag is formed on an Al (aluminum) film having a thickness of 1 to 10 μm, and the uppermost surface is composed of a precious metal film of Au or Ag.

The source electrode 22 and the source lead 26 is wired by a Cu lead 34 having an Ag plating film 33 of a thickness of 0.5 to 5 μm formed on an entire surface thereof. The die pad 16 and the semiconductor device 11, the semiconductor device 11 and the Cu lead 34, and the Cu lead 34 and the source lead 26 are joined by the conductive resin 7 including an Ag particle by 65 to 98 wt %, respectively.

The conductive resin 7 having a high content rate of an Ag particle is preferred to be used for connection between the die pad 16 and the semiconductor device 11. As for connection between the Cu lead 34 and the source lead 26, since only electrical conduction is required mainly, a conductive resin having a content rate of an Ag particle lower than that of the conductive resin 7 used in the connection between the die pad 16 and the semiconductor device 11 can be used.

Molding (enclosing) is performed by insulating mold resin 30 so that a part of the die pad 16, the source lead 26 and the gate lead 27 and the entirety of the semiconductor device 11 and the Cu lead are covered. And, in order to ensure joint strength between the mold resin 30 and the die pad 16, the source lead 26, or the gate lead 27 of the lead frame, chamfered processed portions 36 and 37 are formed in the lead frame so that the resin has an overhung shape.

Since connection reliability of a method in which a rear surface electrode side and a circuit electrode side of a semiconductor device are electrically connected by the conductive resin is low, it is difficult to apply the method to a semiconductor apparatus in which exfoliation may occur in a connection interface because of thermal stress.

However, according to the fourth embodiment, by forming a nano-particle coat film on connection interface in which exfoliation may occur, the connection reliability with the conductive resin 7 can be improved. And therefore, a connection structure using the conductive resin 7 can be applied to a semiconductor apparatus having harsh thermal stress condition.

And, since both die-bonding in a principal surface 11a side of the semiconductor device 11 and electrical connection in a principal surface 11b side which is a circuit surface are performed by joint of the conductive resin 7, a connection processing can be completed at one time, and a manufacturing processing can be made efficient.

And, by changing an electrical connection method between the source electrode and the source lead from wiring by aluminum wire described in the third embodiment to wiring by Cu lead, electrical resistance caused along mounting can be reduced by increase in cross sectional area of conduction or increase in connection area with the source electrode. And therefore, internal loss of the semiconductor apparatus can be reduced.

Fifth Embodiment

In a fifth embodiment, an example in which a nano-particle coat film is formed in a state different from that of the first to fourth embodiments is described. FIG. 14 is a plan view showing a semiconductor apparatus in which an Ag nano-particle coat film exists in a state of scattering in a plurality of regions of a rear electrode surface of a semiconductor device, and FIG. 15 is a cross sectional view taken along a line C-C shown in FIG. 14.

In FIG. 14, on a surface of the metal electrode 12 functioning as a rear surface electrode of the semiconductor device 11, a metal film of, for example, Ti/Ni/Au, Al (aluminum)/Ti/Ni/Au or the like is formed. Although another configuration can be employed as a configuration of the metal film, an uppermost surface has to be precious metal.

And, as shown in FIG. 14 and FIG. 15, on the metal films formed on the surface of the metal electrode 12, a porous Ag nano-particle layer 18 formed by firing an Ag nano-particle is disposed in a dot-like pattern. The nano-particle layer 18 is formed in a state of scattering in the plurality of regions of the surface of the metal electrode 12.

A thickness of the nano-particle layer disposed like dots is 0.1 to 10 μm. The nano-particle layer is formed so that an area ratio of the nano-particle layer 18 with respect to a surface area of the metal electrode 12 is 30% or more. This area rate is a rate of occupancy of a total area of regions in which the nano-particle layer 18 disposed like dots is formed with respect to the surface area of the metal electrode 12. That is, in cases of the second to fourth embodiments in which the nano-particle layer 18 is formed on an entire surface of the metal electrode 12, the area rate is 100%.

From a viewpoint of exfoliation prevention effect of the connection interface between the conductive resin and the metal electrode, the larger the area rate of the region for forming the nano-particle layer 18, the better. However, according to studies of the present inventors, exfoliation of the connection interface can be suppressed if the area rate is 30% or more.

And, in FIG. 15, in a circuit surface side of the semiconductor device 11, the source electrode 22 and the gate electrode 23 of an Al (aluminum) film are formed, and a periphery thereof is covered with a passivation film 38 of inorganic or polyimide.

FIG. 16 is an explanatory diagram showing an example of a formation procedure of the nano-particle coat layer on the rear surface of the semiconductor device.

The nano coat processing is performed in a state of Si wafer. Paste of an Ag nano-particle is finally subjected to dicing by a dispenser and divided into pieces.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor apparatus in which a semiconductor device is electrically connected to a metal member using conductive resin.

What is claimed is:

1. A semiconductor apparatus comprising:
   a semiconductor device having a first principal surface and a second principal surface positioned in mutually opposite sides;
   a first metal member electrically connected to a first electrode formed over the first principal surface via conductive resin composed of an organic binder mixed with metal powder including precious metal by 65 to 98 wt %;
   a first precious metal layer formed by fusing with a surface of the first electrode opposed to the first metal member; and
   an insulating encapsulant enclosing the semiconductor device,
   wherein the surface of the first electrode opposed to the first metal member is composed of precious metal,
   wherein a thickness of the first precious metal layer is 50 nm to 3 μm,
   wherein a surface of the first precious metal layer has a first hole portion plurally in number,
   wherein the first hole portion has a first opening portion and a second opening portion sequentially along a first direction directed from the first electrode to the first metal member, and
   wherein a bulging portion composed of precious metal constituting the first precious metal layer and covering the first opening portion is formed in the second opening portion.

2. The semiconductor apparatus according to claim 1, wherein a second precious metal layer formed by fusing with the first metal member is provided in a region over a surface of the first metal member opposed to the first electrode for mounting the semiconductor device,
   wherein a thickness of the second precious metal layer is 50 nm to 3 μm,
   wherein a surface of the second precious metal layer has a second hole portion plurally in number,
   wherein the second hole portion has a third opening portion and a fourth opening portion sequentially along a second direction directed from the first metal member to the first electrode, and
   wherein a bulging portion composed of precious metal constituting the second precious metal layer and covering the third opening portion is formed in the fourth opening portion.

3. The semiconductor apparatus according to claim 1, wherein the first metal member is composed of one of Cu and alloy including Cu,
   wherein the surface of the first electrode opposed to the first metal member is composed of one of Au and Ag, and
   wherein the first precious metal layer is composed of Ag.

4. The semiconductor apparatus according to claim 1, wherein the first precious metal layer is formed in a state of scattering in a plurality of regions over the surface of the first electrode opposed to the first metal member.

5. The semiconductor apparatus according to claim 1, wherein precious metal is formed by plating in a region over a surface of the first metal member opposed to the first electrode for mounting the semiconductor device.

6. The semiconductor apparatus according to claim 1, further comprising:
   a second metal member electrically connected to a second electrode formed over the second principal surface; and
   a third precious metal layer formed by fusing with a surface of the second electrode opposed to the second metal member,
   wherein the surface of the second electrode opposed to the second metal member is composed of precious metal,
   wherein a thickness of the third precious metal layer is 50 nm to 3 μm,
   wherein a surface of the third precious metal layer has a third hole portion plurally in number,
   wherein the third hole portion has a fifth opening portion and a sixth opening portion sequentially along a third direction directed from the second electrode to the second metal member, and
   wherein a bulging portion composed of precious metal constituting the third precious metal layer and covering the fifth opening portion is formed in the sixth opening portion.

7. The semiconductor apparatus according to claim 6,
wherein the first metal member and the second metal member are composed of one of Cu and alloy including Cu,
wherein the surface of the first electrode opposed to the first metal member and the surface of the second electrode opposed to the second metal member are composed of one of Au and Ag, and
wherein the first precious metal layer and the third precious metal layer are composed of Ag.

8. The semiconductor apparatus according to claim 6,
wherein the first precious metal layer is formed in a state of scattering in a plurality of regions over the surface of the first electrode opposed to the first metal member, and
wherein the third precious metal layer is formed in a state of scattering in a plurality of regions over the surface of the second electrode opposed to the second metal member.

9. The semiconductor apparatus according to claim 6,
wherein a second precious metal layer formed by fusing with the first metal member is provided in a region over a surface of the first metal member opposed to the first electrode for mounting the semiconductor device,
wherein a thickness of the second precious metal layer is 50 nm to 3 µm,
wherein a surface of the second precious metal layer has a second hole portion plurally in number,
wherein the second hole portion has a third opening portion and a fourth opening portion sequentially along a second direction directed from the first metal member to the first electrode, and
wherein a bulging portion composed of precious metal constituting the second precious metal layer and covering the third opening portion is formed in the fourth opening portion.

10. The semiconductor apparatus according to claim 6,
wherein precious metal is formed by plating in a region over a surface of the first metal member opposed to the first electrode for mounting the semiconductor device.

* * * * *